US005940015A

United States Patent [19]

Thornton et al.

[11] Patent Number: 5,940,015

[45] Date of Patent: Aug. 17, 1999

[54] MULTI-PURPOSE KEYPAD AND METHOD OF MANUFACTURING

[75] Inventors: Curtis Thornton; Istvan Bartha, both of Cary, N.C.

[73] Assignee: Ericsson Inc., Research Triangle Park, N.C.

[21] Appl. No.: 08/786,292

[22] Filed: Jan. 22, 1997

[51] Int. Cl.[6] .......... H03M 11/00

[52] U.S. Cl. .......... 341/20; 200/302.2; 200/512; 200/314; 379/368; 379/433

[58] Field of Search .......... 341/22, 20; 379/368, 379/433; 200/512, 302.2, 314; 345/168

[56] References Cited

U.S. PATENT DOCUMENTS

| | | | |
|---|---|---|---|
| 4,331,851 | 5/1982 | Johnson | 200/314 |
| 4,436,965 | 3/1984 | Morse | 200/314 |
| 4,644,326 | 2/1987 | Villalobos | 200/314 |
| 4,764,770 | 8/1988 | Church | 200/512 |
| 4,768,230 | 8/1988 | Viebrantz | 200/314 |
| 4,861,950 | 8/1989 | Yanai | 200/314 |
| 5,386,084 | 1/1995 | Risko | 200/314 |
| 5,625,688 | 4/1997 | Ford | 379/433 |
| 5,664,015 | 9/1997 | Ford | 379/433 |
| 5,681,122 | 10/1997 | Burke | 200/314 |

*Primary Examiner*—Michael Horabik
*Assistant Examiner*—Albert K. Wong
*Attorney, Agent, or Firm*—Nixon & Vanderhye P.C.

[57] ABSTRACT

A multi-purpose keypad for an electronic apparatus includes a main panel formed of a moldable material and a plurality of functional operators formed integral with the main panel. The functional operators extend through openings in the apparatus housing and are selectively engageable with the apparatus printed circuit board (PCB). The integrated structure facilitates manufacturing and assembly of the keypad components and reduces manufacturing time and costs.

16 Claims, 2 Drawing Sheets

MULTI-PURPOSE KEYPAD AND METHOD OF MANUFACTURING

BACKGROUND OF THE INVENTION

The present invention relates to a keypad for an electronic apparatus such as a cellular phone and, in particular, to a multi-purpose keypad and method formed of a moldable material with integral functional operators.

Typical keypads for cellular phones are formed of rubber or like moldable material and cooperate with other components to provide keyboard functionality. The conventional keypad also typically includes a light guide for dispensing light to the keys for background light and provides a dust seal around the keyholes.

The multiple component arrangement of the conventional keypad, however, requires significant manufacturing time and costs. In addition, the manufacturer must maintain a large number of stock articles that comprise the keypad components. Still further, the assembly is more susceptible to tolerance problems by virtue of the multi-component structure.

SUMMARY OF THE INVENTION

It is therefore an object of the invention to provide a multi-purpose keypad that overcomes the drawbacks associated with the conventional multi-component keypad assembly. The multi-purpose keypad according to the invention also adds functionality to the conventional keypad. The keypad according to the invention includes a main panel formed of a moldable material and a plurality of functional operators formed integral with the main panel. By forming the keypad with an integral structure, the number of stock articles for the manufacturer is reduced, manufacturing time and costs are reduced, and any tolerance problems with any of the integrated functions can be located to just one part.

In accordance with exemplary aspects of the invention, the functional operators may include a plurality of function keys and/or at least one of a loud speaker gasket, a microphone gasket and an LCD gasket. The functional operators may also include at least one of a light guide for an LED indicator and a light guide for an LCD or a buzzer seal. The function keys preferably include at least one of volume keys and number keys.

In accordance with another aspect of the invention, there is provided a method of manufacturing the multi-purpose keypad. The method includes the steps of (a) molding the main panel with a moldable material, and (b) forming the functional operators integral with the main panel.

In accordance with still another aspect of the invention, there is provided a cellular phone including a component housing having a plurality of openings therein, a printed circuit board (PCB) disposed in the component housing, and a multi-purpose keypad disposed in the component housing and selectively engageable with the PCB. The multi-purpose keypad includes a main panel formed of a moldable material and a plurality of functional operators formed integral with the main panel. At least some of the functional operators extend out of the component housing through the plurality of openings.

BRIEF DESCRIPTION OF THE DRAWINGS

These and other aspects and advantages of the present invention will be described in detail with reference to the accompanying drawings, in which.

DETAILED DESCRIPTION OF PREFERRED EMBODIMENTS

In the following detailed description, the multi-purpose keypad according to the present invention will be described in connection with its application to a cellular phone. This description, however, is for exemplary purposes only, and the invention is not meant to be limited to a cellular phone. Those of ordinary skill in the art will contemplate other alternative applications for the concepts encompassed by the present invention.

Figure 1:
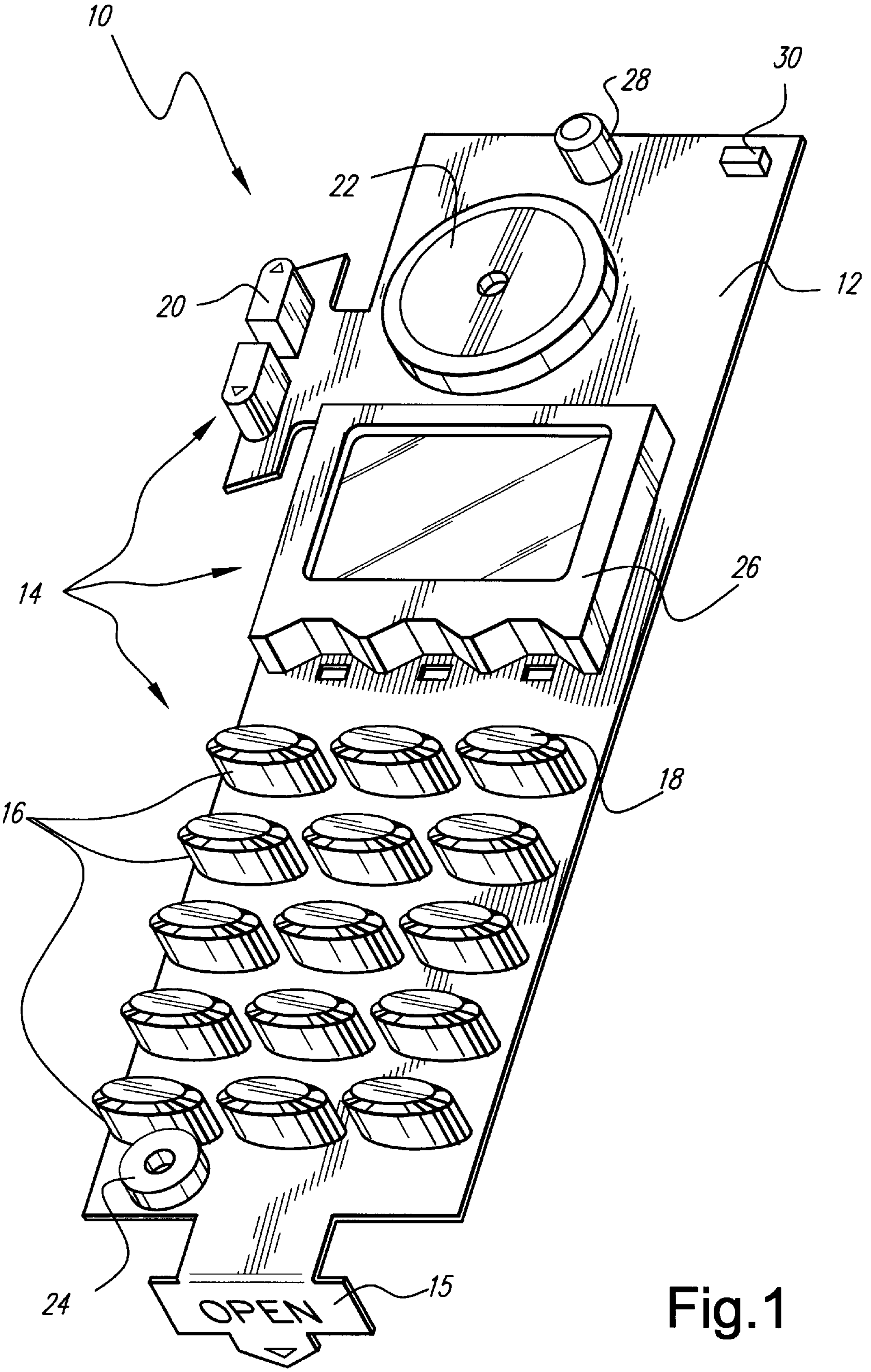
FIG. 1 is a perspective view of the multi-purpose keypad according to the present invention.

FIG. 1 is a perspective view of the multi-purpose keypad 10 according to the present invention. The keypad 10 includes a main panel 12 that is formed of a moldable material, such as semi-transparent rubber. Other suitable materials include silicone rubber or any plastic blend that remains flexible in use. A plurality of functional operators 14 are formed integral with the main panel 12. A system connector lid 15 is also formed integral with the main panel 12.

The functional operators 14, as shown in FIG. 1, include a plurality of function keys 16 such as front number keys 18 and side volume keys 20. The functional operators 14 may also include gaskets that serve to seal cooperating components, such as a loud speaker gasket 22, a microphone gasket 24, and an LCD gasket 26. An LCD shock absorber and light guide may also be integrated with the LCD gasket 26. Other possible components that can be integrated into the multi-purpose keypad according to the invention include a light guide 28 for the LED indicator and a buzzer seal 30 for the ring unit. The functions and operations of the integrated functional operators are well known and will not be further described.

Figure 2:
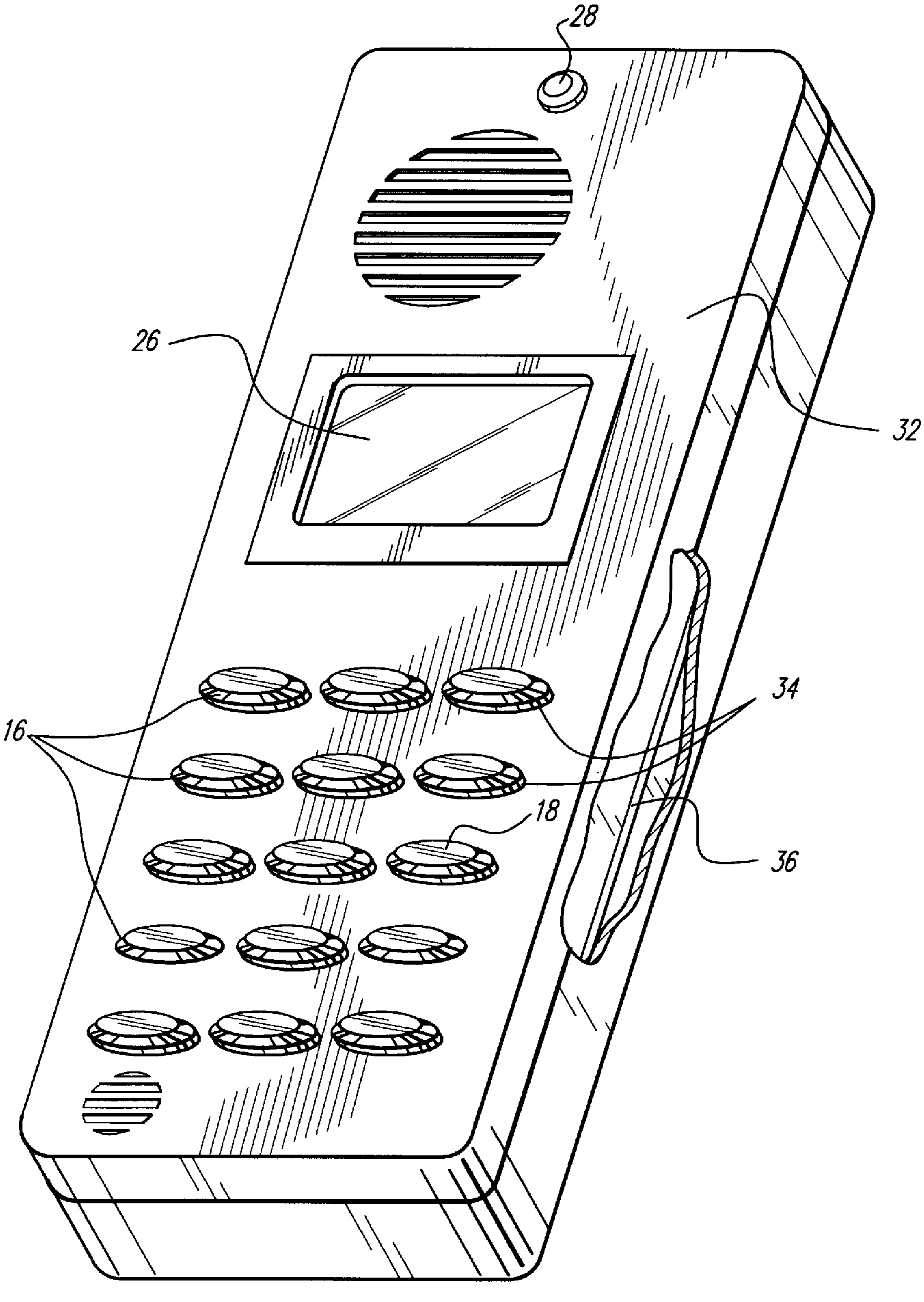
FIG. 2 is a perspective view of a cellular phone incorporating the multi-purpose keypad of the present invention.

As shown in FIG. 2, the multi-purpose keypad 10 is disposed within an apparatus housing 32, which houses the components of the apparatus. The functional operators 14 of the multi-purpose keypad extend through apertures 34 in the component housing 32. The keypad 10 is selectively engageable with the device printed circuit board (PCB) 36, and the function keys 16 such as the number keys 18 and volume keys 20 are disposed adjacent suitable switches on the PCB that are activated when their respective buttons are depressed. One suitable switch is a dome foil type switch (not shown) including conductive contact pills underneath each key. The conductive contact pills impact conductive pads on the board. Alternatively, a separate dome foil with conductive ink can be used.

Identifying indicia, such as numbers or words, are printed where appropriate on the functional operators 14. In this context, pad printing or other suitable printing method may be used on the key tops. Alternatively, a template including the identifying indicia could be secured to the component housing 32.

By virtue of the structure according to the present invention, a multi-purpose keypad is provided including a simplified mechanical design, resulting in reduced assembly costs and manufacturing time. Moreover, the keypad according to the invention integrates the typical keypad components, providing added functionality to the keypad.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A multi-purpose keypad for an electronic apparatus, the keypad comprising a main panel formed of a moldable material, and a plurality of functional operators formed integral with said main panel, wherein said functional operators formed integral with said main panel comprise at least one of a loudspeaker gasket, a microphone gasket, and an LCD gasket.

2. A multi-purpose keypad according to claim 1, wherein said functional operators comprise a plurality of function keys.

3. A multi-purpose keypad according to claim 2, wherein said function keys comprise at least one of volume keys and number keys.

4. A multi-purpose keypad according to claim 2, wherein said functional operators comprise at least one of a light guide for an LED indicator and a light guide for an LCD.

5. A multi-purpose keypad according to claim 2, wherein said functional operators comprise a buzzer seal.

6. A multi-purpose keypad according to claim 1, wherein said functional operators comprise at least one of a light guide for an LED indicator and a light guide for an LCD.

7. A multi-purpose keypad according to claim 1, wherein said functional operators comprise a buzzer seal.

8. A method of manufacturing a multi-purpose keypad for an electronic apparatus, the multi-purpose keypad including a main panel and a plurality of functional operators, the method comprising (a) molding the main panel with a moldable material, and (b) forming the functional operators integral with the main panel in part by forming at least one of a loudspeaker gasket, a microphone gasket, and an LCD gasket integral with the main panel.

9. A method according to claim 8, further comprising printing identifying indicia on the functional operators.

10. A method according to claim 8, wherein step (b) is practiced by (c) forming a plurality of function keys.

11. A method according to claim 10, wherein step (c) is practiced by forming at least one of volume keys and number keys.

12. A method according to claim 10, wherein step (b) is further practiced by forming at least one of a light guide for an LED indicator and a light guide for an LCD.

13. A method according to claim 10, wherein step (b) is further practiced by forming a buzzer seal.

14. A method according to claim 8, wherein step (b) is practiced by forming at least one of a light guide for an LED indicator and a light guide for an LCD.

15. A method according to claim 8, wherein step (b) is practiced by forming a buzzer seal.

16. A cellular phone comprising:

a component housing having a plurality of openings therein;

a printed circuit board (PCB) disposed in said component housing; and a multi-purpose keypad disposed in said component housing and selectively engageable with said PCB, said multi-purpose keypad including a main panel formed of a moldable material and a plurality of functional operators formed integral with said main panel, at least some of said functional operators extending out of said component housing through said plurality of openings, including at least one side functional operator extending out of said component housing through one of said plurality of openings in a side of said component housing.

* * * * *